(12) United States Patent
Richter et al.

(10) Patent No.: US 7,611,991 B2
(45) Date of Patent: Nov. 3, 2009

(54) TECHNIQUE FOR INCREASING ADHESION OF METALLIZATION LAYERS BY PROVIDING DUMMY VIAS

(75) Inventors: Ralf Richter, Dresden (DE); Matthias Schaller, Dresden (DE); Ellen Claus, Dresden (DE); Eckhard Langer, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 366 days.

(21) Appl. No.: 11/470,024

(22) Filed: Sep. 5, 2006

(65) Prior Publication Data
US 2007/0123009 A1 May 31, 2007

(30) Foreign Application Priority Data
Nov. 30, 2005 (DE) .................. 10 2005 057 076

(51) Int. Cl.
*H01L 21/44* (2006.01)
(52) U.S. Cl. .................. 438/687; 257/E21.579
(58) Field of Classification Search .......... 438/687; 257/E21.579
See application file for complete search history.

(56) References Cited

U.S. PATENT DOCUMENTS

| | | | |
|---|---|---|---|
| 6,109,775 A | 8/2000 | Tripathi et al. | |
| 6,468,894 B1 | 10/2002 | Yang et al. | 438/622 |
| 6,576,923 B2 * | 6/2003 | Satya et al. | 257/48 |
| 6,864,171 B1 | 3/2005 | Hoinkis | |
| 2004/0043618 A1 * | 3/2004 | Hellig et al. | 438/694 |
| 2005/0121788 A1 | 6/2005 | Watanabe et al. | |
| 2005/0142840 A1 * | 6/2005 | Fujimaki | 438/622 |
| 2006/0145347 A1 * | 7/2006 | Aida | 257/758 |

FOREIGN PATENT DOCUMENTS

| | | | | |
|---|---|---|---|---|
| JP | 08097290 A | 4/1996 | | 21/82 |
| KR | 1020050062067 A | 6/2005 | | 21/66 |

OTHER PUBLICATIONS

Search Report Dated Mar. 19, 2007 (US/06/044291).

* cited by examiner

*Primary Examiner*—Trung Dang
(74) *Attorney, Agent, or Firm*—Williams, Morgan & Amerson, P.C.

(57) ABSTRACT

By providing dummy vias below electrically non-functional metal regions, the risk for metal delamination in subsequent processes may be significantly reduced. Moreover, in some embodiments, the mechanical strength of the resulting metallization layers may be even more enhanced by providing dummy metal regions, which may act as anchors for an overlying non-functional metal region. In addition, dummy vias may also be provided in combination with electrically functional metal lines and regions, thereby also enhancing the mechanical stability and the electrical performance thereof.

8 Claims, 5 Drawing Sheets

TECHNIQUE FOR INCREASING ADHESION OF METALLIZATION LAYERS BY PROVIDING DUMMY VIAS

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The fabrication of a plurality of metallization layers entails extremely challenging issues to be solved, such as mechanical, thermal and electrical reliability of a plurality of stacked layers. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper and alloys thereof are materials that are increasingly used to replace aluminum due to their superior characteristics in view of higher resistance against electromigration and significantly lower electrical resistivity when compared with aluminum. Despite these advantages, copper and copper alloys also exhibit a number of disadvantages regarding the processing and handling in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called inlaid or damascene technique (single and dual) is preferably used, wherein a dielectric layer is first applied and then patterned to receive trenches and/or vias, which are subsequently filled with copper or copper alloys.

It turns out that the process of forming vias and trenches in the dielectric material of the respective metallization layer according to the damascene regime may significantly affect the overall production yield during the formation of advanced semiconductor devices having copper-based metallization layers owing to delamination issues and etch-related geometry effects.

With reference to FIGS. 1a-1d, a typical conventional process flow will now be described in more detail so as to more clearly demonstrate the problems involved in forming highly scaled metal lines in a dielectric material according to a damascene process, for instance, a dual damascene process, in which vias are formed prior to corresponding trenches connected to the vias, wherein this approach is often called a "via first/trench last" approach.

FIG. 1a schematically shows a cross-sectional view of a semiconductor device 100 comprising a substrate 101, which may be provided in the form of a bulk silicon substrate, a silicon-on-insulator (SOI) substrate and the like, wherein the substrate 101 may also represent a device layer having formed therein individual circuit elements, such as transistors, capacitors, lines, resistors, contact portions and the like. For convenience, any such circuit elements are not shown in FIG. 1a. The device 100 comprises a first device region 120A and a second device region 120B, wherein the first device region 120A may represent an "inner" region that receives metal lines and vias, whereas the second device region 120B may represent a device region for receiving a large metal area in the respective metallization layer together with corresponding metal lines in the first device region 120A. For example, a measurement region and the like may be formed in the second device region 120B, as is typically provided for evaluating so-called dishing effects occurring during the removal of excess copper by chemical mechanical polishing (CMP).

The device 100 further comprises a dielectric layer 102 formed above the substrate 101, wherein the layer 102 may represent a dielectric material enclosing the individual circuit elements, also referred to as a contact material, or the layer 102 may represent a portion of a lower-lying metallization layer, in which any metal-filled lines may be embedded. Depending on the specific design of the device 100, or the function of the layer 102, it may be comprised of a conventional dielectric material such as silicon dioxide, silicon nitride, or it may comprise a low-k dielectric material such as, for instance, hydrogen-enriched silicon oxycarbide (SiCOH) and the like. A metal line 103A is formed within the first device region 120A and above the substrate 101 and at least partially within the layer 102 for establishing an electric connection to circuit elements formed within the first device region 120A. The metal line 103A may be comprised of a copper-containing metal including conductive barrier layers (not shown) so as to enhance adhesion of the metal line 103A to the surrounding material and reduce diffusion of copper into sensitive device regions. An etch stop layer 104 is formed on the dielectric layer 102 and the metal line 103A, wherein the etch stop layer 104 may be comprised of a material that exhibits a high etch selectivity to the material of a dielectric layer 105 formed on the etch stop layer 104. Furthermore, the etch stop layer 104 may also act as a diffusion barrier between the metal line 103A and neighboring materials to reduce the out-diffusion of metal, such as copper, and diffusion of dielectric material into the metal line 103A.

The dielectric layer 105, which may be comprised of a low-k dielectric material, is formed on the etch stop layer 104, followed by an anti-reflective coating (ARC) layer or capping layer 106, which may be formed from two or more sub-layers so as to achieve the desired performance with respect to the optical behavior, mechanical strength and masking characteristics. For instance, the capping layer 106 may be provided as a stack including a silicon dioxide layer (acting to impart improved mechanical strength to the layer 105 when formed of a low-k material), a silicon oxynitride layer for adapting the optical behavior and a thin silicon dioxide layer acting as a nitrogen barrier for a resist mask 107 formed on the capping layer 106. The resist mask 107 includes a first opening 107A above the first device region 120A that corresponds to a via opening 105A for electrically connecting the metal line 103A with a metal line still to be formed in the dielectric layer 105.

A typical process flow for forming the semiconductor device 100 as shown in FIG. 1a may comprise the following processes. After the fabrication of any circuit elements within the substrate 101, the dielectric layer 102 may be deposited by well-established deposition recipes based on plasma enhanced chemical vapor deposition (PECVD). For example, the layer 102 may be comprised of silicon dioxide, fluorine-doped silicon dioxide or SiCOH and hence deposition recipes on the basis of appropriate precursors may be employed to form the layer 102. Then, the metal line 103A may be formed in accordance with processes as will be described in the following with reference to the layer 105. Thereafter, the etch stop layer 104 is deposited by, for instance, well-established PECVD techniques with a thickness that is sufficient to reliably stop a via and trench etch process to be performed later on. Next, the dielectric layer 105 is formed by CVD or spin-coating, depending on the material used. Then, the capping layer 106 is formed by PECVD techniques on the basis of well-established recipes to provide the desired characteristics in the further processing of the device 100. Finally, the resist mask 107 may be formed by advanced photolithography to form the respective opening 107A. Thereafter, an anisotropic etch process is performed, wherein, in an initial phase, the exposed portion of the layer 106 is removed and, in a subsequent process, the dielectric material of the layer 105 is removed to form the via opening 105A.

FIG. 1b schematically illustrates the device 100 in an advanced manufacturing stage. The device 100 now comprises a resist mask 109 having formed therein a trench 109A above the via opening 105A with dimensions corresponding to design dimensions of a metal line to be formed above and around the via opening 105A. The resist mask 109 further comprises an opening 109B in the second device region 120B formed in accordance with the design dimensions for a corresponding metal region, such as a test region, wherein the dimensions of the opening 109B may be significantly greater compared to the dimension of the trench 109A, at least in one dimension. For instance, the opening 109B may have a design dimension of 100 μm×100 μm in advanced semiconductor devices of minimal critical dimensions of 50 nm or even less. Moreover, a fill material 108 is formed underneath the resist mask 109, wherein the fill material 108 is also provided within the opening 105A. The fill material may be comprised of a photoresist of different type compared to the resist mask 109, or the fill material 108 may represent any other polymer material that may be applied in a low viscous state to fill the opening 105A while providing a substantially planar surface. The fill material 108 may also serve as an ARC layer during the patterning of the resist mask 109.

The resist mask 109 may be formed by first applying the fill material 108 by, for example, spin-coating a resist or a polymer material, then applying a photoresist by spin-coating, performing a well-established photolithography process and etching or dry-developing the fill material 108 on the basis of the resist mask 109. Thereafter, the device 100 is subjected to an etch ambient 110 on the basis of carbon and fluorine to etch through the layer 106 and remove a portion of the layer 105 to form a trench around the via opening 105A and an opening in the second device region 120B corresponding to the opening 109B, while the fill material 108 in the via opening 105A prevents substantial material removal therein. Moreover, the fill material 108 within the opening 105A, although partially removed during the etch process 110, protects the remaining etch stop layer 104 in the opening 105A so that the metal line 103A is not exposed to the etch ambient 110. Thereafter, a trench of specified depth is formed around the via opening 105A and a corresponding opening in the second device region 120B, the resist mask 109 and the fill material 108 are removed by, for instance, an oxygen-based plasma treatment.

During the etch process 110, the removal rate for material of the dielectric layer 105 may significantly depend on the geometric structure of the trenches and openings to be formed in the dielectric layer 105. For example, the etch rate at the trench opening 109A, when for instance representing an isolated trench, may be significantly higher compared to the rate at the opening 109B designed to represent a test region. Generally, in modern semiconductor devices, substantially continuous non-tiled metal plates of increased dimensions compared to metal lines in product areas may be required for a variety of test and measurement tasks. Consequently, due to the structure and geometry dependent etch behavior, the etch depth and thus the finally achieved thickness of the large-area metal regions may be reduced compared to actual metal lines, thereby potentially resulting in an overall reduced stability of the respective metallization layer.

FIG. 1c schematically shows the device after the above process sequence with a trench 111A and an opening 111B formed in the layer 106 and the dielectric layer 105 in the first and second device regions 120A and 120B, respectively. Moreover the device is subjected to a further etch process 112 to remove the remaining etch stop layer 104 to thereby connect the via opening 105A to the metal region 103. The via opening 105A, the trench 111A and the opening 111B may then be filled with metal, such as copper or copper alloys, by electrochemical deposition techniques, wherein, prior to the electrochemical deposition, corresponding barrier and seed layers may be formed.

FIG. 1d schematically depicts the device 100 after completion of the above-described process sequence. Thus, the device 100 comprises a metal-filled via 113A connecting to the metal region 103 and a metal line 112A formed above the via 113A. In the second device region 120B, a metal area 112B is formed, whose thickness may be reduced compared to the thickness of the metal line 112A due to potential etch non-uniformities during the etch process 110, as previously explained. Moreover, the metal area 112B may exhibit a reduced adhesion to the adjacent dielectric material of the layer 105, which may cause delamination of metal during manufacturing processes after the metal deposition, such as CMP and the like, during which increased mechanical stress may be applied to the device 100. Consequently, production yield may be compromised and device performance reduced.

In view of the situation described above, there exists a need for an improved technique which solves or at least reduces the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of metallization layers of semiconductor devices including large-area metal regions with enhanced stability in that the large-area metal region is formed above at least some dummy vias connected thereto, thereby increasing the adhesion to the surrounding dielectric material and potentially reducing etch non-uniformities during the formation of respective openings within the dielectric materials. A dummy via may be understood as a metal-filled plug extending at least partially through the dielectric material towards a lower-lying material layer, wherein the dummy via, in contrast to functional vias provided in product areas of a semiconductor device, may not be electrically connected to any semiconductor circuit elements that are required for a specified circuit layout of an integrated circuit to be operational. By providing additional dummy vias, the effective adhesion area with respect to the neighboring dielectric material of an overlaying metal region may be significantly increased, which may reduce the probability for the occurrence of metal delamination and other defect mechanisms during the formation of metallization layers in advanced semiconductor devices.

According to one illustrative embodiment of the present invention, a method comprises identifying a region of reduced via density in a metallization layer of a semiconductor device and forming a dummy via in the identified region. Moreover, the method comprises forming a metal region above the identified region, wherein the metal region is connected to the dummy via.

According to another illustrative embodiment of the present invention, a method comprises forming a plurality of vias in a first portion of a first dielectric layer of a semiconductor device, wherein at least some of the plurality of vias are electrically non-functional vias. Furthermore, the method comprises forming a first metal region in a second portion of the first dielectric layer, wherein the second portion is located above the first portion and the first metal region is connected to at least one of the electrically non-functional vias.

According to yet another illustrative embodiment of the present invention, a semiconductor device comprises one or more semiconductor circuit elements formed above the substrate and a metallization layer formed above the one or more semiconductor circuit elements. The metallization layer comprises a first metal region and one or more dummy vias located below the first metal region, wherein one end of the one or more dummy vias is connected to the first metal region, while the other end remains insulated from the one or more semiconductor circuit elements.

BRIEF DESCRIPTION OF THE DRAWINGS

The invention may be understood by reference to the following description taken in conjunction with the accompanying drawings, in which like reference numerals identify like elements, and in which.

Figure 1A:
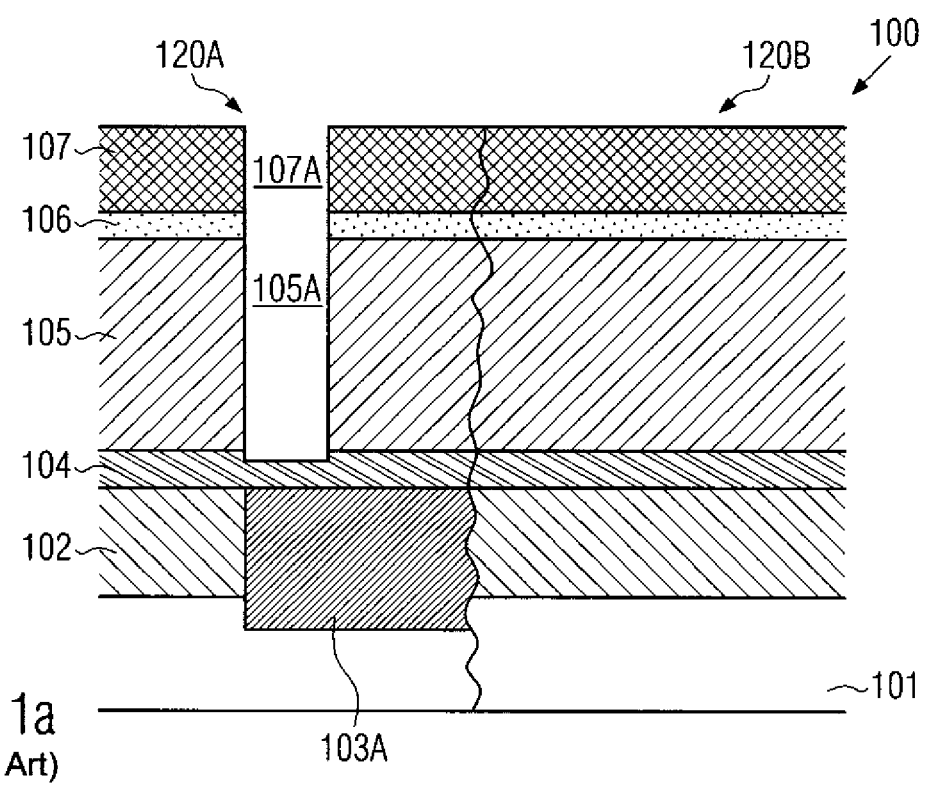
FIGS. 1a-1d schematically show cross-sectional views of a semiconductor device during the formation of a metallization layer including metal lines and a large-area metal region for test purposes during various manufacturing stages in accordance with a conventional process technique.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally directed to a technique for forming metallization layers in accordance with a damascene or inlaid strategy, wherein, in addition to metal lines and vias, large-area metal regions are also provided. In this respect, a metallization layer is to be understood as a dielectric layer formed above a device layer, i.e., one or more layers having formed therein semiconductor circuit elements, such as transistors, capacitors, resistors and the like, wherein metal lines and metal regions are provided in the dielectric material, which provide the inner layer electrical connection of circuit elements, whereas vias may be connected at certain locations to the respective metal lines to establish an electrical connection to a lower-lying metal region, thereby finally providing an electrical connection to one or more of the semiconductor circuit elements within the device layer.

As previously explained, in highly sophisticated semiconductor devices, highly conductive metals, such as copper and copper alloys, are typically used which may be formed on the basis of the damascene technique, in which the dielectric material is provided with respective openings that are subsequently filled with the copper or copper alloy, thereby requiring advanced anisotropic etch techniques. Moreover, copper and alloys thereof are frequently used in combination with low-k dielectric materials, i.e., materials having a dielectric constant of 3.0 or even less, which may exhibit a reduced adhesion to the filled-in metal. Consequently, an increased probability for metal delamination from the surrounding dielectric material may be observed, in particular, when metal regions of increased lateral dimensions are to be formed in a specified metallization layer. For example, in some metallization layers of a metallization stack, metal regions may be provided for test purposes which may have no electrical connection to a lower-lying metal or contact region. Due to the reduced adhesion to the surrounding dielectric material, particularly if a low-k dielectric material is considered, a high risk of metal delamination may exist in subsequent process steps, such as CMP, and/or the metal thickness may vary significantly within a metallization layer, or from layer to layer, due to a significant non-uniformity of the geometric structure of a metallization layer, which may include a plurality of metal lines having design dimensions in accordance with the design rules, while metal regions with significantly increased lateral dimensions compared to the regular metal lines are also provided. For example, in advanced semiconductor devices, a width of a metal line in a lower metallization layer may be in the range of 1 μm or even less, while, on the other hand, large-area metal regions are included having lateral dimensions of, for instance, 80 μm×80 μm so that at least one lateral dimension is significantly larger compared to the width of the regular metal lines.

Without intending to restrict the present invention to the following explanation, it is believed that a significant non-uniformity during the anisotropic etch process for forming respective openings for metal lines and other metal regions is caused or influenced by the geometric difference in dimensions and shape, resulting in a reduced etch depth of large-area openings that are formed above a substantially via-free area. For example, recent investigations performed by the inventors seem to indicate that a metal region formed above a dense via area is thicker than a metal region formed above an area without vias or with a significantly reduced via density. Consequently, the present invention contemplates the introduction of additional dummy vias, i.e., vias that are not required for the electrical functionality of the semiconductor device under consideration, so as to reduce process non-uniformities during the formation of metal lines and large-area metal regions, wherein the additional dummy vias significantly enhance the overall adhesion surface area that is provided for the overlying metal region, thereby significantly enhancing the overall adhesion to the surrounding dielectric material.

Figure 1B:
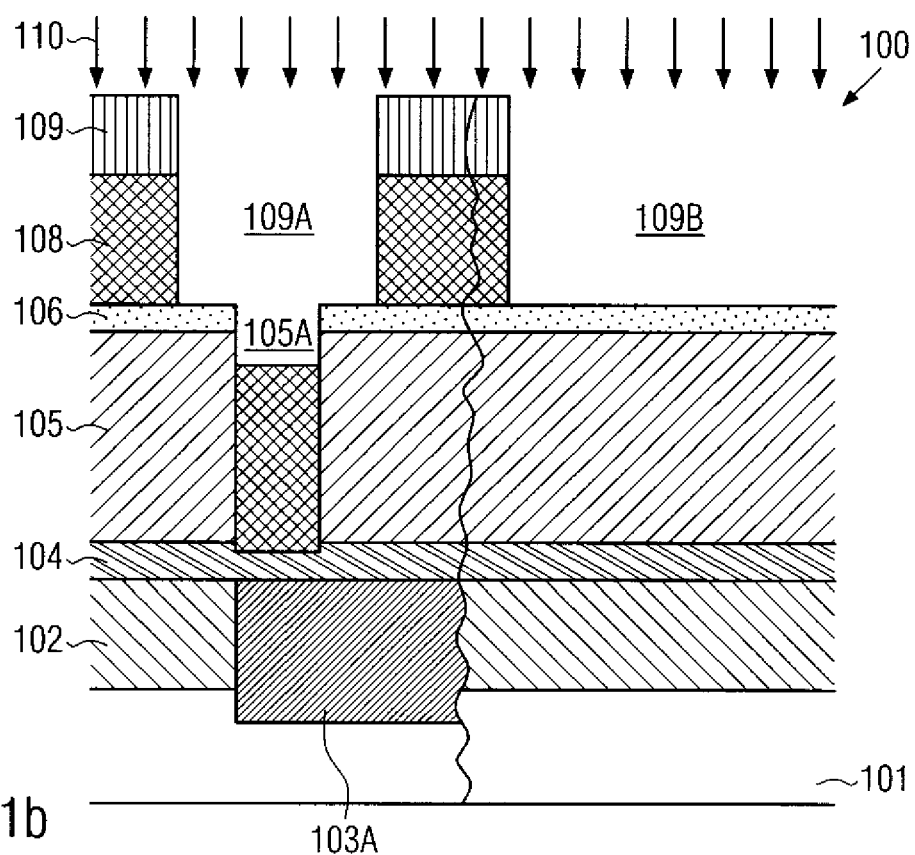
Figure 1C:
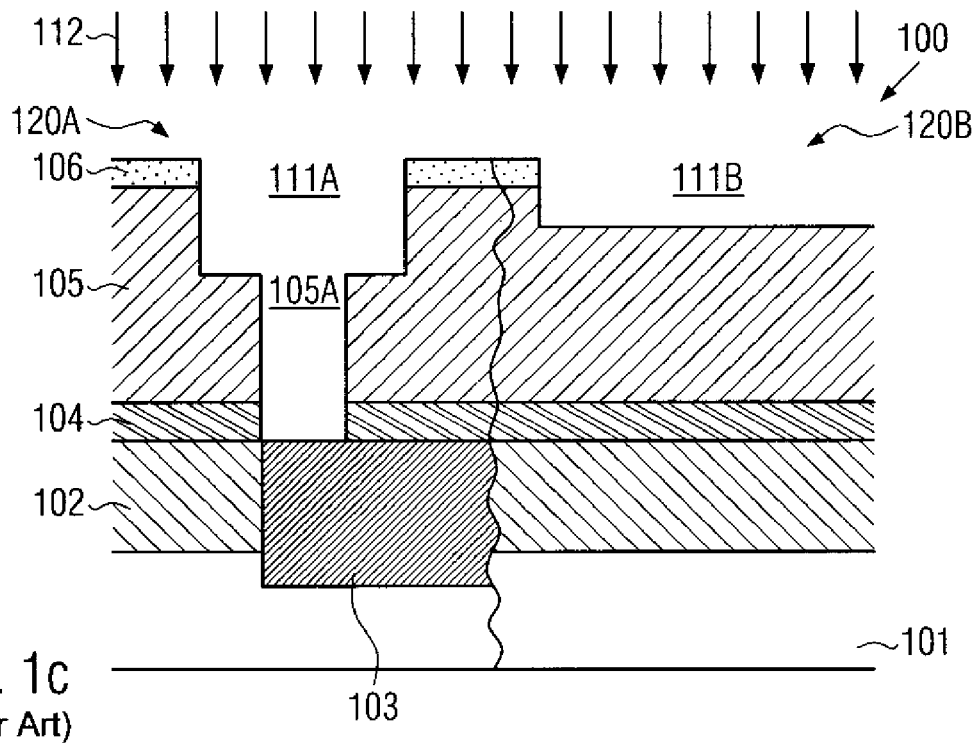
Figure 1D:
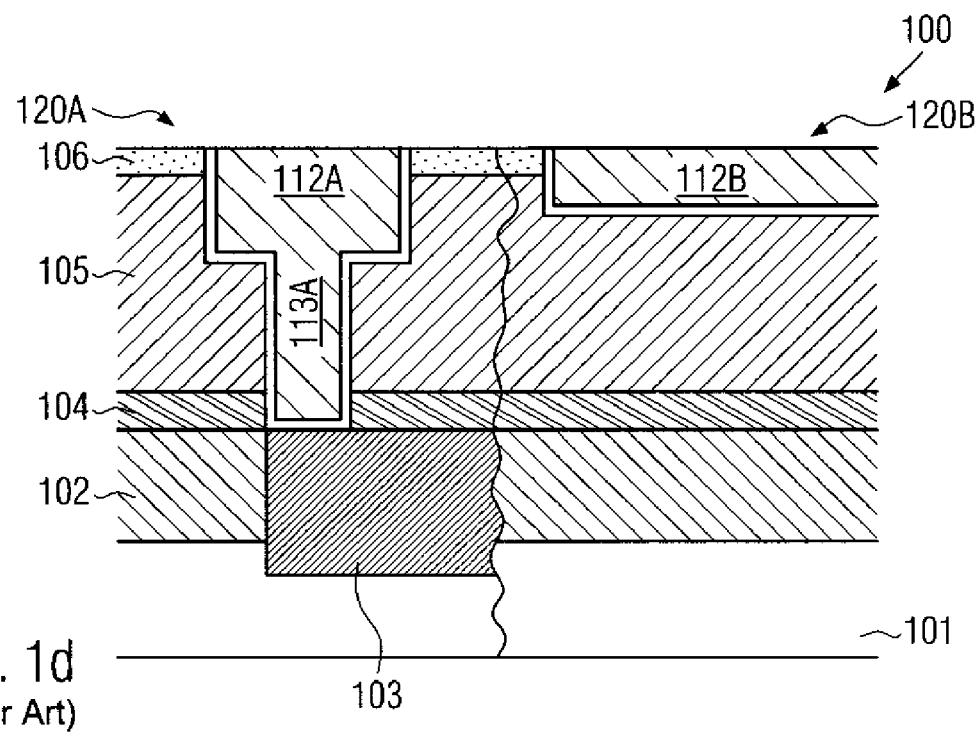
Figure 2A:
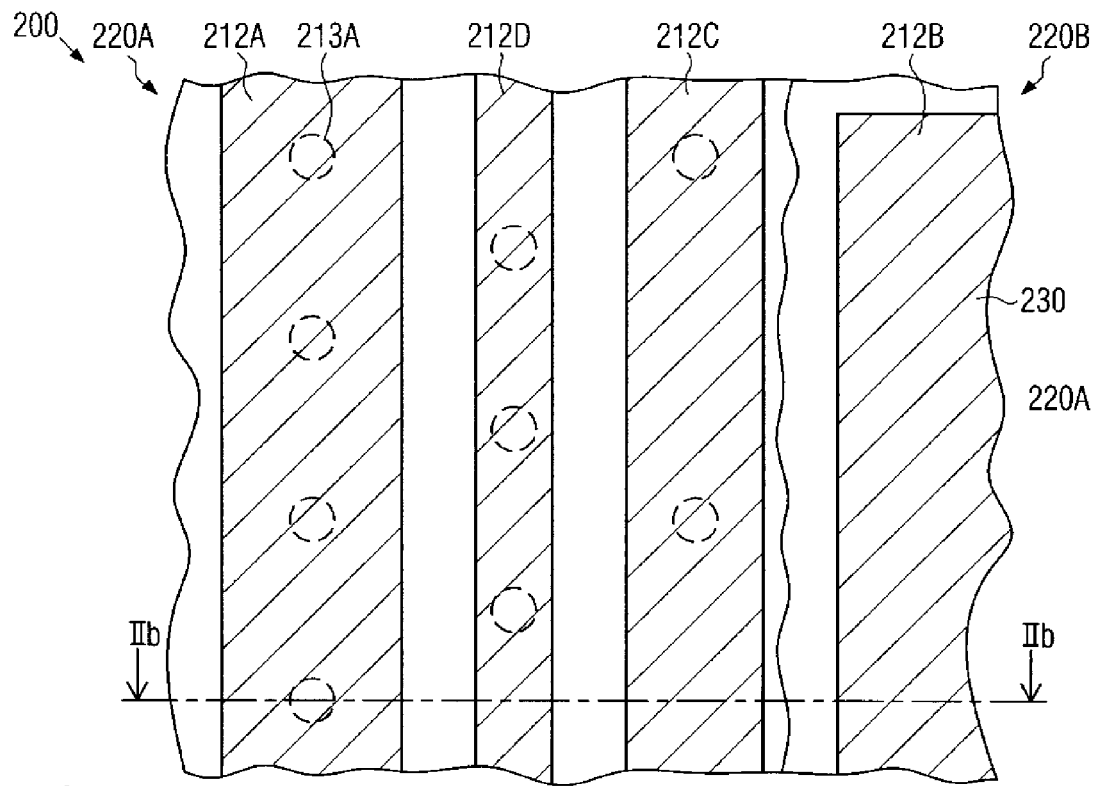
FIGS. 2a-2b schematically show a top view and a cross-sectional view, respectively, of a semiconductor device in the form of a design layout, which may be used for identifying areas in a metallization layer having a reduced via density.

With reference to FIGS. 2a-2e and 3, further illustrative embodiments of the present invention will now be described in more detail. FIG. 2a schematically illustrates a top view of a semiconductor device 200, wherein FIG. 2a may be understood as representing a circuit layout of an integrated circuit that may be included in the semiconductor device 200. In other cases, the semiconductor device 200 may be understood as representing a certain type of semiconductor device including all the functional and non-functional components as required for the fabrication of a specific type of semiconductor device. For instance, the semiconductor device 200 may represent the layout or a real version of a semiconductor device similar to that shown in FIGS. 1a-1b, in which areas of reduced via density in a specific metallization layer may be located and identified. Hence, the semiconductor device 200 or the layout thereof may comprise one or more metallization layers, one of which is indicated in the top view of FIG. 2a by reference number 230. The device 200 may comprise at least a first device region 220A and a second device region 220B, which may not necessarily be located in the same die region, when the second device region 220B is to represent a specified test region that has to be provided at a few specified substrate locations only. In other illustrative embodiments, the first and second device regions 220A and 220B may be located within the same die region, i.e., within a portion formed above an appropriate substrate, which may act as a functional unit after dicing the substrate and separating the individual die regions. The first device region 220A may include a plurality of metal lines 212A, 212C, 212D that may be connected by respective vias 213A to any lower-lying contact regions or metal regions. It should be appreciated that the metal lines 212A, 212C, 212D of the metallization layer 230 formed in the first device region 220A may have substantially the same configuration or may differ in size, depending on the design requirements. By way of example, one of the exemplary metal lines, i.e., the line 212A, may have a greater width compared to the metal lines 212C, 212D. Moreover, the vias 213A are shown to have substantially the same design dimensions, whereas, in other illustrative embodiments, respective vias may have different dimensions.

In the second device region 220B, a metal region 212B may be provided, which may exhibit significantly increased dimensions, at least in one lateral direction, wherein an area corresponding to the metal region 212B may have a significantly reduced via density compared to the corresponding metal-containing regions represented by the metal lines 212A, 212C and 212D. It should be appreciated that the term "via density" is to be understood as the number or the area of vias formed below a respective metal region and being connected thereto. In other words, a via density may be understood as the ratio of the total area occupied by the vias 213A with respect to the total area of a corresponding metal region, such as the metal line 212A. For example, the via density of the area corresponding to the metal region 212B may be zero, since in this stage of design or manufacture no vias are provided for the metal region 212B, since no electrical connection is required to any lower-lying circuit elements. On the other hand, the metal line 212A may exhibit a moderately high via density, depending on the total area of the metal line 212A and the size and number of vias 213A connected thereto.

Figure 2B:
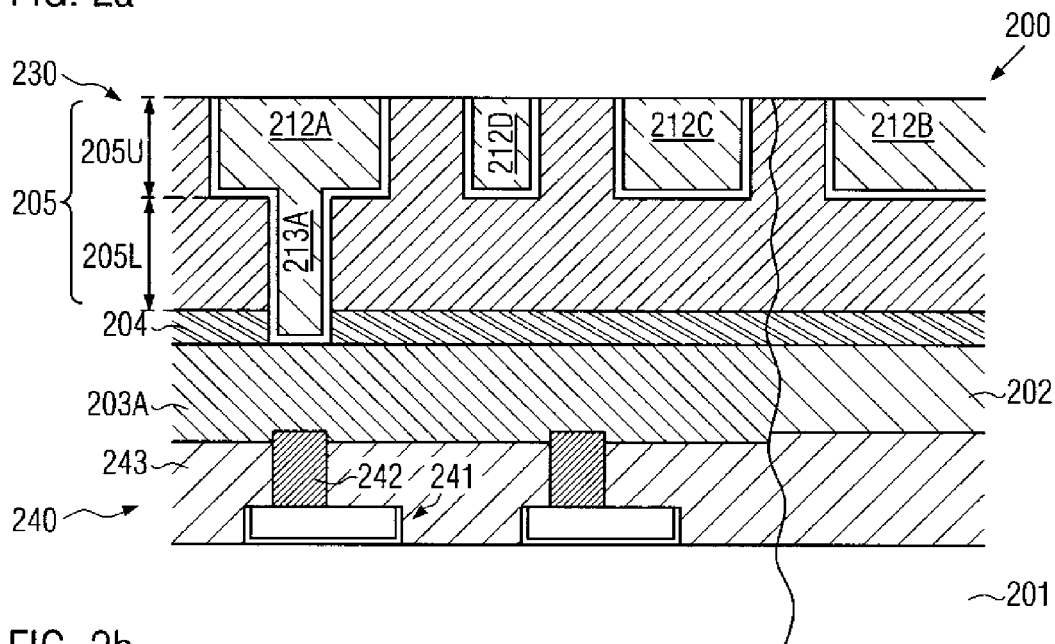

FIG. 2b schematically shows a cross-sectional view of the layout of the device 200, wherein the cross-section is taken along the line indicated in FIG. 2a as IIb. Hence, the device 200 or its layout may comprise a substrate 201 in and on which is provided a device layer 240, which may include a plurality of circuit elements, such as semiconductor circuit elements in the form of transistors, resistors, capacitors and the like. The corresponding circuit elements are collectively indicated as 241, which may represent, in the illustrative embodiment depicted in FIG. 2b, a field effect transistor, wherein the cross-section is taken along the transistor width direction, that is, the horizontal direction in FIG. 2b may represent the width direction of the transistor 241. Moreover, the device layer 240 may include metal-containing contact plugs 242 that are formed within an interlayer dielectric material 243 and which may be connected to respective contact regions of the circuit elements 241. Provided above the device layer 240 may be a first metallization layer, which may be represented by a dielectric layer 202 and a plurality of metal lines included therein, which are represented by a metal line 203A which extends along, for instance, the transistor width direction, i.e., along the horizontal direction in FIG. 2b.

It should be appreciated that, in advanced semiconductor devices including a plurality of metallization layers, typically the metal lines of one metallization layer are substantially parallel to each other, while the metal lines of an adjacent metallization layer are also substantially parallel but perpendicular to the metal lines of the adjacent metallization layers. It should be appreciated, however, that the principles of the present invention are not restricted to any particular configuration or orientation of metal lines within a specific metallization layer.

Above the first metallization layer represented by the dielectric layer 202 and the metal line 203A may be a further metallization layer, such as the metallization layer 230, as illustrated in FIG. 2a. Consequently, in the first device region 220A, the respective metal lines 212A, 212D and 212C may extend substantially perpendicularly to the metal line 203A and may be formed in an upper portion 205U of a dielectric layer 205. Furthermore, the vias 213A may extend through a lower portion 205L of the dielectric layer 205 so as to connect a respective metal line with a corresponding metal region or metal line of a lower-lying metallization layer. In the present example, it may be assumed that the metal line 212A may be connected to the metal line 203A by means of the via 213A corresponding to the location as specified in FIG. 2a. It should be noted that the other metal lines 212D, 212C may also be connected by respective vias 213A with other metal lines contained in the dielectric layer 202, which, however, may not be visible in the cross-section of FIG. 2b.

It should also be appreciated that, ideally, a thickness of the upper portion 205U of the dielectric layer 205 is defined by a thickness of the corresponding metal lines 212A, which is, in the design, identical for all metal lines and regions. In this respect, it should be noted that, in some embodiments of advanced semiconductor devices, the dielectric layer 205 may be provided as a substantially continuous dielectric layer, typically comprised of a low-k dielectric material, wherein the finally obtained thickness and thus height of the metal lines 212A, 212D and 212C is defined by an etch process. Similarly, in the second device region 220B, the metal region 212B is provided in the upper portion 205U, wherein, as previously explained, in a real device, the height of the metal region 212B may differ significantly from the corresponding heights of the metal lines 212A, 212D and 212C due to any etch non-uniformities when the thickness of the upper portion 205U is defined by the etch process rather than by any etch stop layers or other process techniques, in which the vias 213A and the metal lines and metal regions in the upper portion 205U are formed in separate processes, as will be explained in more detail later on. Moreover, the manufacturing sequence for forming the semiconductor device 200 in an actual hardware configuration will be described later on with reference to FIG. 2d.

On the basis of the semiconductor device 200, i.e., its design layout, as is illustratively depicted in FIGS. 2a-2b, specific areas in the metallization layer 230 may be identified in which a reduced via density is encountered. In one illustrative embodiment, the metal region 212B may represent a test structure, for instance for providing process data with respect to a CMP process with respect to dishing effects and the like, so that, with respect to any electrical considerations, the region 212B may be regarded as a non-functional region, which, however, may significantly influence the manufacturing process and also the subsequent behavior of the device 200, for instance with respect to metal delamination and other defect sources. Due to the non-required electrical function of the region 212B, initially no vias may be provided below the region 212B. Consequently, the area including the metal region 212B may be identified as an area with reduced via density, wherein a corresponding threshold or other comparison criterion for indicating an area as an area of reduced via density may be established on the basis of empirical data, process models and the like. In one illustrative embodiment, in addition to any electrically non-functional metal regions, such as the region 212B, electrically functional regions may also be examined with respect to their via density so as to identify a reduced via density. For example, in the embodiment shown, the metal line 212C may be identified as an area of reduced via density, wherein, depending on the configuration of the underlying metallization layer, specific areas may be determined which may be appropriate for receiving additional dummy vias to enhance the overall performance of the metal line 212C.

After the identification of respective areas with reduced via density, the semiconductor device 200, i.e., its design layout, may be re-designed to include at least some dummy vias in the one or more identified regions of reduced via density. In one illustrative embodiment, the area of the lower portion 205L of the dielectric layer 205, located below the metal region 212B, may be identified as a corresponding region of reduced via density and thus the design of the semiconductor device 200 may be altered to include one or more dummy vias located below the metal region 212B and connected thereto. In still other embodiments, functional metal regions, such as the metal line 212C, may be identified as being located above a region of reduced via density, wherein, in this case also, certain areas in the lower portion 205L of the dielectric layer 205 may be identified which may be appropriate for receiving additional dummy vias without providing electrical contact to any lower-lying metallization layers.

Figure 2C:
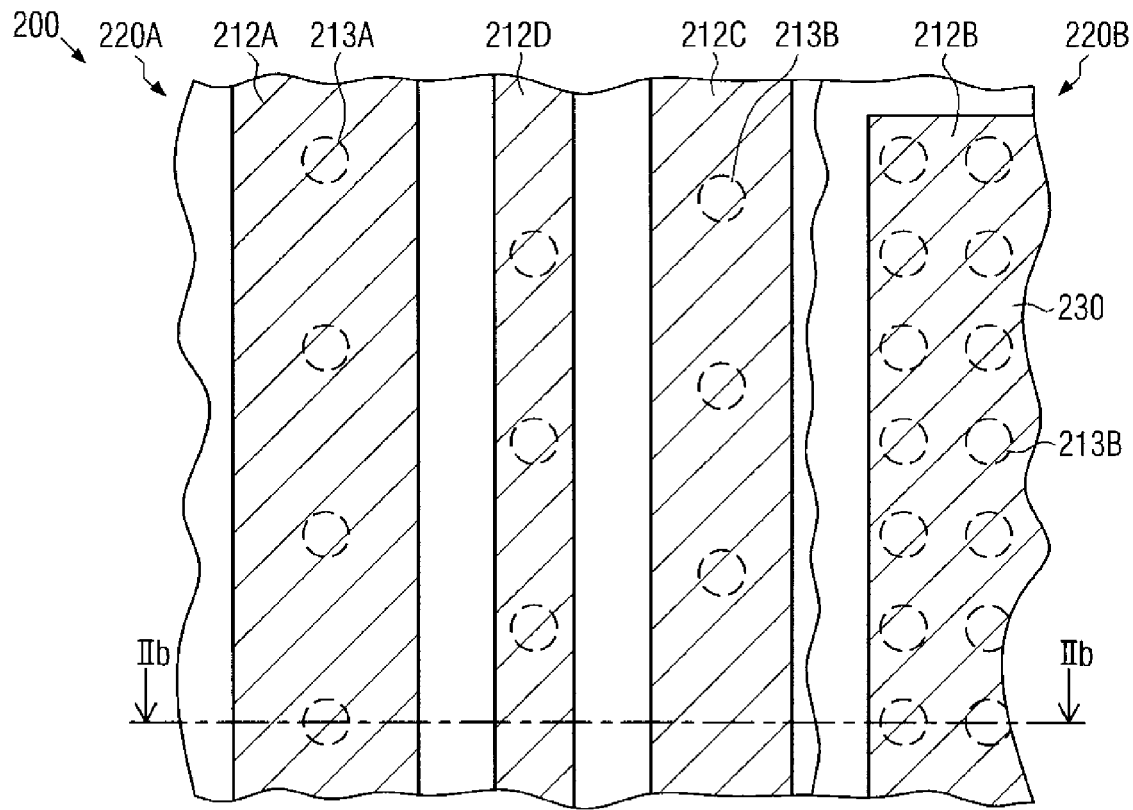
FIG. 2c schematically shows a top view of a semiconductor device comprising a plurality of dummy vias within a specified metallization layer in an area that has previously been identified as having a reduced via density.

FIG. 2c schematically shows the semiconductor device 200 or its modified layout in a top view, wherein at least some additional dummy vias are provided in order to enhance the performance of the respective overlying metal regions. In FIG. 2c, a plurality of dummy vias 213B are provided, which are connected to the metal region 212B and which may terminate in a dielectric material, such as the layer 202 (FIG. 2b), without affecting the electric functionality of the semiconductor device 200. Moreover, in one illustrative embodiment, additional dummy vias 213B may also be provided in one or more of the electrically functional metal lines, such as the line 212C, wherein a sufficient lateral distance with respect to any metal lines provided in the dielectric layer 202, such as the metal line 203A, may be maintained in order to reliably avoid any shortage between the metal line 212C and a lowerlying metal line for which no electrical connection is included in the original design of the device 200.

It should be appreciated that, in some illustrative embodiments, the dummy vias 213B may have substantially the same configuration as the functional vias 213A, thereby ensuring a high degree of process uniformity during the formation of the vias 213A and the dummy vias 213B. In other illustrative embodiments, the dummy vias 213B or a portion thereof may be formed on the basis of different design criteria, thereby providing the potential for specifically enhancing the performance in combination with the respective overlying metal regions. For example, it may be advantageous to increase the size of the dummy vias 213B and/or alter the distance between adjacent vias in order to enhance the mechanical stability of the dielectric material that remains between the dummy vias 213B. Moreover, the shape of the dummy vias 213B may be selected on the basis of mechanical criteria rather than adopting design criteria appropriate for the functional vias 213A. For instance, the cross-section, when viewed in the top view of FIG. 2c, may have any appropriate shape, such as circular, polygonal, square, rectangular and the like.

Figure 2D:
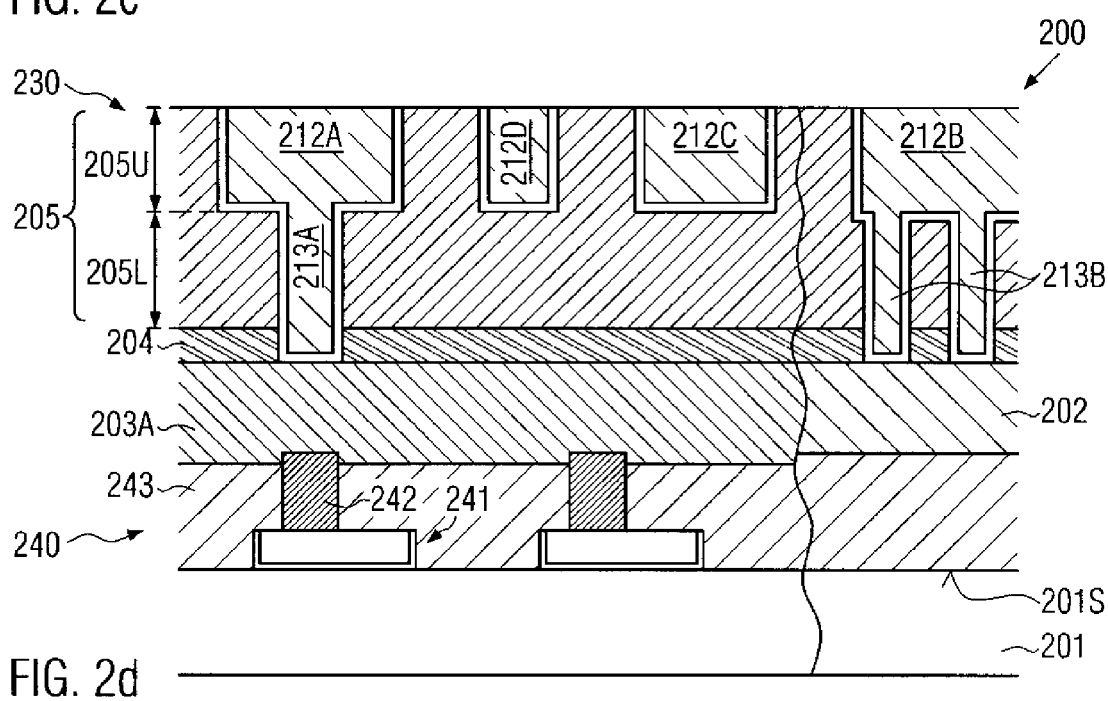
FIGS. 2d-2e schematically illustrate cross-sectional views of a semiconductor device having formed therein a plurality of dummy vias.

FIG. 2d schematically shows a cross-sectional view of the semiconductor device 200 according to a real implementation on the basis of the device 200 as shown in FIG. 2c, which comprises the additional dummy vias 213B. The cross-section of FIG. 2d may be taken along the line indicated by IId, similar to the cross-section as shown in FIG. 2b.

Thus, the semiconductor device 200 as shown in FIG. 2d comprises the substrate 201, which may represent any appropriate substrate having formed thereon a semiconductor layer suitable for the formation of the circuit elements 241, such as transistors, capacitors, resistors and the like. The substrate 201 may represent, in some embodiments, a bulk silicon substrate having formed thereon an appropriate crystalline semiconductor layer, or, in other embodiments, the substrate 201 may represent an SOI substrate having formed thereon a semiconductor layer separated from the rest of the substrate by a buried insulating layer, wherein this arrangement may provide enhanced performance in terms of operating speed, radiation immunity and the like. It should be appreciated, however, that any other appropriate semiconductor materials may be used, wherein, in particular, in sophisticated applications, the substrate 201 may have formed therein crystalline regions of different crystallographic orientations and/or inherent strain and/or different material compositions, and the like. The substrate 201 comprises the first device region 220A, which may represent a region of the device 200 including the plurality of circuit elements 241 and interconnect structures providing the electrical connections between the individual circuit elements 241. The second device region 220B may represent a region that may include circuit elements (not shown) which may not need to be connected by any overlying metallization layer, or the region 220B may represent an area of the substrate 201 reserved for test and measurement purposes, wherein, as previously explained, the first and the second device regions 220A, 220B may be provided within the same die or, in other embodiments, the second device region 220B may be provided at specified locations across the entire substrate 201. Formed in and on the substrate 201 are the circuit elements 241 and the corresponding contact plugs 242, thereby forming the device layer 240. In advanced semiconductor devices, the circuit elements 241 may have a minimum critical dimension, such as a gate length of field effect transistors, i.e., in FIG. 2d, a dimension in the direction perpendicular to the drawing plane of FIG. 2d, of approximately 50 nm and even less. The circuit elements 241 and the respective contact plugs 242 may be formed in the dielectric layer 243, which may be provided as a layer stack including dielectric materials, such as silicon nitride, silicon dioxide, silicon oxynitride, silicon carbide, nitrogen-enriched silicon carbide and the like.

The semiconductor device 200 further comprises a first metallization layer comprised of the dielectric layer 202 and a plurality of metal lines, which are represented by the metal line 203A. As is shown, the metal line 203A may extend across a significant portion of the first device region 220A, while substantially no metal lines are formed in the dielectric layer 202 corresponding to the second device region 220B. In advanced semiconductor devices, the layer 202 may comprise a low-k dielectric material, wherein, in some illustrative embodiments, an appropriate low-k material may be hydrogenated silicon oxycarbide (SiCOH), whereas, in other illustrative embodiments, other suitable low-k polymer material may be used. Formed above the dielectric layer 202 and the metal line 203A is the etch stop layer 204, which may be comprised of silicon nitride, silicon carbide, nitrogen-enriched silicon carbide and the like. Formed above the etch stop layer 204, which also acts as a capping layer for the metal line 203A, is the metallization layer 230, which may represent, in this illustrative embodiment, the second metallization layer. The metallization layer 230 may comprise the dielectric layer 205, which may include the upper layer portion 205U and the lower portion 205L, wherein the lower portion 205L may be defined by the vias 213A, 213B extending through the lower portion 205L. Similarly, the upper portion 205U may be defined by the vertical extension of the respective metal lines 212A, 212D, 212C and the metal region 212B. In this respect, it should be appreciated that any positional information and statements, such as "upper," "lower," "above," "below," "vertical," "horizontal," "lateral" and the like may be understood with respect to the substrate 201. For example, a lateral direction is to be considered as a direction substantially extending parallel to a surface 201S of the substrate 201. A component or layer is located below another layer when the distance of the former component or layer with respect to the surface 201S is less compared to the latter layer.

Contrary to the conventional device as described with reference to FIGS. 1a-1d, the dummy vias 213B are provided below the metal region 212B and are connected thereto with one end, while the other end of the dummy vias 213B may terminate in the dielectric material of the layer 202. Due to the provision of the dummy vias 213B, the overall surface of the metal comprising the region 212B and the dummy vias 213B that is in contact with the dielectric material of the layer 205 is significantly increased, thereby providing an enhanced adhesion so that a delamination of the metal region 212B during the formation of the semiconductor device 200 may be significantly reduced. As previously explained, copper-based metals are typically used in combination with low-k dielectric materials, which per se exhibit a reduced mechanical stability. Hence, during thermal and mechanical stress encountered during the fabrication and/or the operation of the device 200, a reduced adhesion of the copper-based metal to the surrounding dielectric material may result in an increased defect rate, a partial or even total delamination of a specified metal region, or any other defect mechanisms. For example, in advanced devices, extremely high current densities may be encountered during the operation of the device, wherein a reduced adhesion of the metal line to the surrounding dielectric material may also reduce the resistance against electromigration, thereby significantly affecting the overall reliability of the metal line under consideration and thus of the entire semiconductor device 200. Even if the metal region 212B is to represent a test area located outside of an actual die region, a reduced adhesion during the subsequent manufacturing processes may result in a reduced reliability of the corresponding metal regions in the first device region 220A, since the reduced mechanical stability during, for instance, a CMP process, which may be substantially caused by the reduced adhesion of the regions 212B, may also affect adjacent die regions including the first device region 220A, thereby also rendering these device regions less reliable during the subsequent processing and even later on during the operation of the finally completed semiconductor device 200, which may no longer include the metal region 212B.

A typical process flow for forming the semiconductor device 200 may comprise substantially the same processes as previously described with reference to the semiconductor device 100. Hence, after the formation of the circuit elements 241 within the device layer 240 including the contact plugs 242 on the basis of well-established recipes, the first metallization layer, represented by the dielectric layer 202 and the one or more metal lines 203A, may be formed on the basis of well-established techniques wherein, as previously explained, a low-k dielectric material is frequently used in combination with copper or copper alloys. Thereafter, the second metallization layer 230 may be formed by providing an appropriate dielectric material, such as a low-k dielectric material, wherein, in one illustrative embodiment, corresponding via openings may be formed in the upper and lower portions 205U, 205L of the dielectric layer 205 on the basis of the modified layout design as shown in FIG. 2c. Consequently, a plurality of respective via openings are also formed at least below an area corresponding to the metal region 212B still to be formed. In other embodiments, as previously explained, respective via openings may also be formed in any device areas that may have been identified as areas of reduced via density on the basis of the initial design layout of the device 200 described with reference to FIGS. 2a-2b.

Thereafter, by well-established techniques, corresponding openings for the metal lines 212A, 212D, 212C and the metal region 212B may be formed above the corresponding via openings including openings for the functional vias 213A and the dummy vias 213B. As previously noted, during the corresponding anisotropic etch process for forming the respective openings, a significantly increased process uniformity may be achieved, since similar etch conditions may be established for forming the opening for the region 212B and for the formation of the trench openings corresponding to the regions 212A, 212D, 212C. As a consequence, the respective openings for the regions 212A, 212D, 212C and 212B may be formed with substantially a similar depth in the upper layer portion 205U so that, in general, a more uniform and enhanced metal thickness may be obtained in the metallization layer 230. Thereafter, the corresponding openings may be filled with appropriate barrier and seed layers followed by the deposition of the actual metal in a common manufacturing process.

In further illustrative embodiments, the respective openings for the metal lines 212A, 212D, 212C and for the metal region 212B may be formed first in the upper portion of dielectric layer 205 and thereafter the corresponding via openings for the vias 213A, 213B may be formed. Even in this case, an enhanced reliability of the resulting metal region 212B may be achieved, since even after any etch non-uniformities may have occurred, which may result in a reduced depth of the opening corresponding to the metal region 212B, the dummy vias 213B may nevertheless provide enhanced adhesion of the region 212B, thereby significantly reducing the risk for any metal delamination in subsequent processes.

Figure 2E:
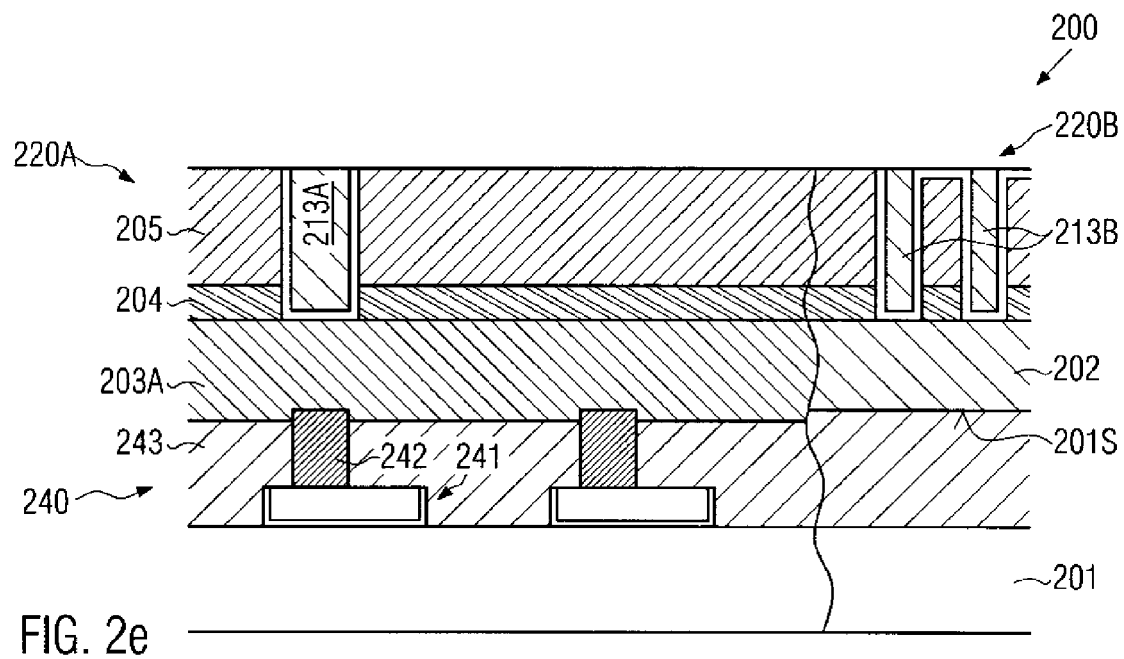

FIG. 2e schematically shows the semiconductor device 200 according to another illustrative embodiment, wherein the vias 213A and the dummy vias 213B are completely formed prior to the formation of the corresponding metal lines and metal regions. For this purpose, the lower portion 205L may be formed and may be subsequently patterned to receive corresponding via openings in accordance with the design of the semiconductor device 200 as shown in FIG. 2c. Thereafter, the respective openings may be coated with appropriate barrier and seed materials and thereafter the actual metal, such as copper, may be deposited on the basis of well-established techniques. Next, any excess material may be removed, for instance by CMP and/or electrochemical etch techniques. Thereafter, the upper portion 205U may be formed, possibly by providing an intermediate etch stop layer, and may then be patterned to provide the corresponding openings for the metal lines 212A, 212D, 212C and the metal region 212B, which are then filled with barrier material and the actual metal. As a result, an enhanced reliability for the metal region 202B may also be obtained for the device 200 as fabricated according to FIG. 2e.

Figure 3:
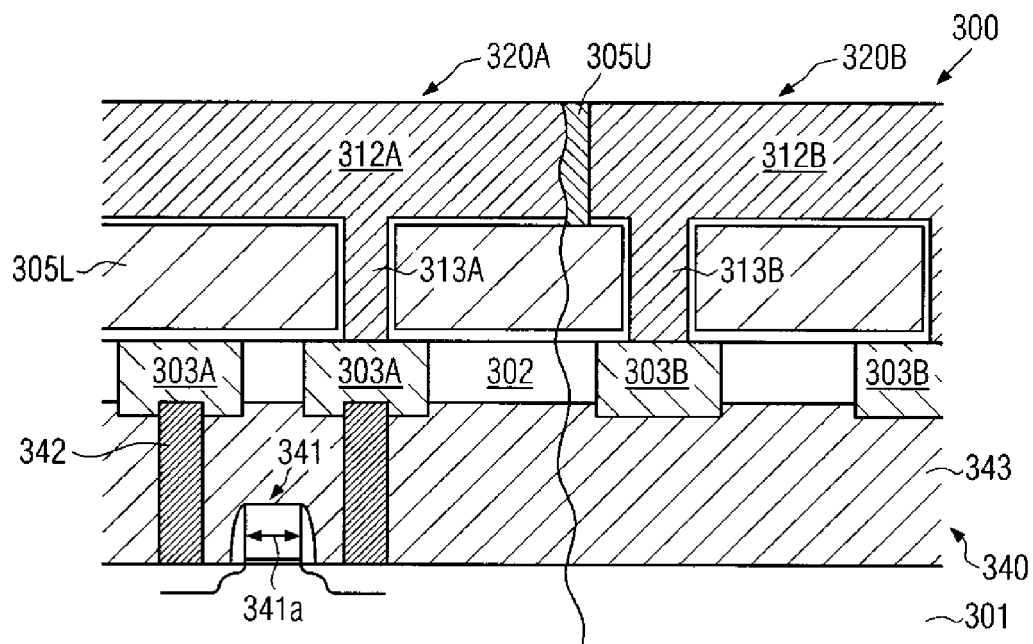
FIG. 3 schematically illustrates a cross-sectional view of a semiconductor device including a large-area metal region formed above a plurality of dummy vias, which in turn are connected to a dummy metal region in a lower-lying metallization layer.

FIG. 3 schematically shows a cross-sectional view of a semiconductor device 300 in accordance with yet another illustrative embodiment of the present invention. The semiconductor device 300 may comprise substantially the same components as the semiconductor device 200. Hence, the device 300 may comprise a substrate 301 on which is formed a device layer 340 including a plurality of circuit elements 341, such as field effect transistors, which may have, for instance, a minimal critical dimension 341A of 50 nm or even less. The device layer 340 may further comprise corresponding contact plugs 342 which may be connected to respective metal lines 303A formed in a dielectric layer 302. Contrary to the previously described embodiments, the device 300 may comprise, in a second device region 320B, one or more dummy metal regions 303B, which may comprise, together with the metals lines 303A and the dielectric layer 302, the first metallization layer of the device 300. In other embodiments, the metal lines 303A and the dummy metal regions 303B may be part of a higher metallization layer so that the metal lines 303A may not be directly in contact with the respective contact plugs 342. Moreover, a further metallization layer 330, in the illustrated embodiment the second metallization layer, is formed to include a plurality of functional vias 313A connecting to respective metal lines 303A, while a plurality of dummy vias 313B may be provided, wherein at least some of the dummy vias 313B may connect to a respective dummy metal region 303B. Moreover, corresponding metal lines 312A may be formed in the first device region 320A, while a metal region 312B, such as a large-area test region and the like, may be formed above the dummy vias 313B.

Regarding the process flow for forming the semiconductor device 300, the same criteria apply as previously explained with reference to the semiconductor devices 100 and 200. It should be appreciated, however, that a corresponding design of the semiconductor device 300 is altered with respect to the design of the semiconductor device 200 so as to now obtain the dummy metal regions 303B in any appropriate size and shape. For example, the dummy metal regions 303B may represent metal lines extending substantially parallel to the metal lines 303A, whereas, in other embodiments, the dummy metal regions 303B may represent metal islands on which one or more dummy vias 303B terminate. The dummy metal regions 303B are electrically non-functional in the sense that these dummy metal regions 303B may not provide an electrical contact to any of the circuit elements 341. It should be appreciated, however, that a plurality of corresponding dummy metal regions 303B may be provided in other adjacent metallization layers, wherein at least the very first dummy metal region, i.e., the dummy metal region located closest to the substrate 301, may not be electrically connected to respective circuit elements 341. Due to the provision of the dummy metal regions 303B, which act as "anchors" for the dummy vias 313B and thus for the corresponding metal regions 312B, the mechanical stability of the metallization layer 330 may be even more enhanced.

As a result, the present invention provides a new technique for the formation of metallization layers including electrically non-functional metal regions, the mechanical stability of which may be significantly enhanced by forming one or more dummy vias below the corresponding metal regions. Moreover, by identifying device areas with reduced via density and by correspondingly re-designing the semiconductor device under consideration, an enhanced process uniformity may be achieved, thereby also contributing to an overall performance gain and/or to an enhanced production yield. Furthermore, the provision of dummy vias may not be restricted to electrically non-functional metal regions but may also be applied to metal lines and other metal regions, thereby also enhancing the electrical as well as mechanical performance of these functional metal lines and regions. For example, by providing any dummy vias for a metal line, the overall resistance thereof may be reduced and at the same time the mechanical stability thereof may be significantly enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

identifying a region of reduced via density in a metallization layer of a semiconductor device by determining an area in said metallization layer for receiving a metal region therein on the basis of design rules for said semiconductor device, determining a number of functional vias located below said metal region and connected thereto and obtaining a measure for a density of said functional vias on the basis of design values relating to said metal region and said functional vias, wherein the region is identified based on said measure;

forming a dummy via in said identified region beneath said metal region; and forming the metal region above said identified region, said metal region connecting to said dummy via.

2. The method of claim 1, wherein identifying said region of reduced via density further comprises comparing said measure with a reference criterion and re designing design rules for said semiconductor device to include at least one dummy via located below said metal region when a result of said comparing indicates a reduced via density.

3. The method of claim 1, wherein said dummy via has substantially the same design dimensions as a functional via to be formed in said metallization layer.

4. The method of claim 1, wherein forming said dummy via and said metal region comprises:

forming a dielectric layer above a substrate;

forming a via opening in said dielectric layer;

forming an opening above said via opening in said dielectric layer; and commonly filling said via opening and said opening with a metal.

5. The method of claim 1, wherein forming said dummy via and said metal region comprises:

forming a first dielectric layer above a substrate;

forming said dummy via in said first dielectric layer;

forming a second dielectric layer above said first dielectric layer including said dummy via; and forming said metal region in said second dielectric layer.

6. The method of claim 1, wherein forming said dummy via and said metal region comprises:

forming a dielectric layer above a substrate;

forming an opening corresponding to said metal region in said dielectric layer;

forming a via opening in said opening; and commonly filling said opening and said via opening with a metal.

7. The method of claim 1, wherein said metal region represents a test region.

8. The method of claim 7, wherein said metal region represents a metal line having at least one functional via connected thereto so as to establish an electric connection to at least one circuit element.

* * * * *